United States Patent [19]

Yoshimura

[11] Patent Number: 4,902,395

[45] Date of Patent: Feb. 20, 1990

[54] METHOD OF MANUFACTURING SURFACE COATED CARBO-NITRIDE TITANIUM-BASE CERMET MATERIALS FOR INSERTS OF HIGH-SPEED CUTTING TOOLS

[75] Inventor: Hironori Yoshimura, Tokyo, Japan

[73] Assignee: Mitsubishi Kinzoku Kabushiki, Tokyo, Japan

[21] Appl. No.: 266,487

[22] Filed: Nov. 2, 1988

Related U.S. Application Data

[63] Continuation-in-part of Ser. No. 118,452, Nov. 9, 1987, abandoned.

[30] Foreign Application Priority Data

Nov. 25, 1986 [JP]  Japan .................................. 61-280268

[51] Int. Cl.$^4$ ............................................. C23C 14/32
[52] U.S. Cl. .................................... 204/192.3; 427/38; 427/37
[58] Field of Search ............... 204/192.31; 427/38–39; 428/698

[56] References Cited

U.S. PATENT DOCUMENTS 4,401,719  8/1983  Kobayashi et al. ............... 428/457

Primary Examiner—Aaron Weisstuch
Attorney, Agent, or Firm—Frishauf, Holtz, Goodman & Woodward

[57] ABSTRACT

A method of manufacturing a surface-coated TiCN-base cermet material for inserts of cutting tools. A substrate of a TiCN-base cermet is prepared. Then, a hard surface layer is coated over surfaces of the substrate, the layer being formed of one of a single layer of one compound selected from the group consisting of TiC, TiN, and TiCN, and a composite layer of at least two compounds selected from the same group. In coating the hard surface layer, an ion plating method is applied under the conditions that the reaction temperature is 700°–1000° C., the voltage applied on the substrate $(-)100-(-)1000$ volts, and the pressure of the reaction atmosphere $1 \times 10^{-5}$–$2 \times 10^{-4}$ torr. The hard surface layer thus obtained has a mean thickness within a range from 0.5 to 10 microns and a mean grain size of not more than 0.05 microns.

9 Claims, No Drawings

METHOD OF MANUFACTURING SURFACE COATED CARBO-NITRIDE TITANIUM-BASE CERMET MATERIALS FOR INSERTS OF HIGH-SPEED CUTTING TOOLS

BACKGROUND OF THE INVENTION

This application is a continuation-in-part application of Ser. No. 118,452, filed Nov. 9, 1987, abandoned.

This invention relates to a method of manufacturing surface coated carbo-nitride titanium-base cermet materials for inserts of cutting tools, which are so excellent in wear resistance and chipping resistance as to exhibit excellent cutting performance when used in high speed cutting.

There are generally known cermet materials used as cutting inserts for cutting steel, which is manufactured by subjecting a substrate of a carbo-nitride base cermet (hereinafter called "TiCN-base cermet") to chemical vapor deposition or physical vapor deposition to have surfaces thereof coated with a hard surface layer formed of a single layer of one compound selected from the group consisting of carbide titanium (TiC), nitride titanium (TiN), and carbo-nitride titanium (TiCN), or a composite layer of two or more compounds selected from the same group, the hard surface layer having a mean thickness of 0.5–10 microns.

In recent years, in order to attain higher production efficiency, i.e. reduce the manufacturing cost, cutting has a tendency toward higher speed. However, if the above surface coated TiCN-base cermet materials, manufactured through ordinary chemical vapor deposition or physical vapor deposition, are used in cutting steel or the like at a high cutting speed of 250 meters per minute or more, they show rather short tool lives owing to insufficient wear resistance and insufficient chipping resistance of the hard surface layer.

SUMMARY OF THE INVENTION

It is therefore the object of the invention to provide a method of manufacturing a surface coated TiCN-base cermet material for inserts of cutting tools, which can exhibit satisfactory wear resistance as well as excellent chipping resistance even when used as cutting inserts in high speed cutting at 250 meters per minute or more.

To attain the above object, the present invention provides a method of manufacturing a surface-coated TiCN-base cermet material for inserts of cutting tools, comprising the steps of:

(a) preparing a substrate of a TiCN-base cermet; and (b) coating over surfaces of the substrate a hard surface layer formed of one of a single layer of one compound selected from the group consisting of TiC, TiN, and TiCN, and a composite layer of at least two compounds selected from the same group, by means of an ion plating method under the following conditions:

Reaction Temperature: 700–1000° C.;

Voltage Applied on Substrate: $(-)100-(-)1000$ volts; and

Pressure of Reaction Atmosphere: $1 \times 10^{-5} - 2 \times 10^{31 4}$ torr, whereby the hard surface layer has a mean thickness within a range from 0.5 to 10 microns and a mean grain size of not more than 0.05 microns.

The above and other objects, features, and advantages of the invention will be more apparent from the ensuing detailed description.

DETAILED DESCRIPTION

Under the aforestated circumstances, the present applicant has made studies in order to improve the conventional surface coated TiCN-base cermet materials for inserts of cutting tools, and has reached the finding that if in the conventional surface coated TiCN-base cermet materials a hard surface layer is formed, by means of an ion plating method, which is a kind of physical vapor deposition method, over the substrate under the following conditions:

Reaction Temperature: 700–1000° C.;

Voltage Applied on Substrate: $(-)100-(-)1000$ volts; and

Pressure of Reaction Atmosphere: $1 \times 10^{-5} - 2 \times 10^{-4}$ torr, the resulting hard surface layer has a fine structure having a mean grain size of not more than 0.05 microns, substantially smaller than the conventional range of 0.1–0.2 microns and having enhanced bond strength to the substrate, which has greatly enhanced wear resistance and chipping resistance so that the cermet material can exhibit excellent cutting performance over a long tool life, if it is used in high speed cutting of steel or the like at a speed of 250 meters per minute or more.

The present invention is based upon the above finding, and provides a method of manufacturing a surface-coated TiCN-base cermet material having the aforestated steps.

Throughout the whole specification percentage is percent by weight.

The substrate of the surface coated TiCN-base cermet material according to the method of the invention may be a conventional one. For example, the substrate may be prepared from a cermet having any one of the following chemical compositions (a)–(d):

(a) at least one compound selected from the group consisting of Co and Ni: 5–25 %;

at least one compound selected from the group consisting of a carbide of Mo ($Mo_2C$) and a carbide of W (WC): 5–25%;

at least one compound selected from the group consisting of a carbide of Ta (TaC) and a carbide of Nb (NbC): 1–30%; and TiCN: the balance;

(b) at least one compound selected from the group consisting of Co and Ni: 5–25%;

Al: 0.01–2%;

at least one compound selected from the group consisting of $Mo_2C$ and WC: 5–25%;

at least one compound selected from the group consisting of TaC and NbC: 1–30%; and TiCN: the balance;

(c) at least one compound selected from the group consisting of Co and Ni: 5–25%;

at least one compound selected from the group consisting of $Mo_2C$ and WC: 5–25%;

at least one compound selected from the group consisting of TaC and NbC: 1–30%;

at least one compound selected from the group consisting of a carbide of Zr (ZrC) and a carbide of Hf (HfC): 0.1–10%; and TiCN: the balance; or (d) at least one compound selected from the group consisting of Co and Ni: 5–25%;

Al: 0.01–2%;

at least one compound selected from the group consisting of $Mo_2C$ and WC: 5–25%;

at least one compound selected from the group consisting of TaC and NbC: 1-30%;

at least one compound selected from the group consisting of ZrC and HfC; 0.1-10%: and TiCN the balance The above cermet is formed by sintering a green compact formed by press molding under one of the following sintering conditions (i) to (iii):

(i) Sintering Temperature: 1350°-1500° C.;
Atmosphere at Sintering Temperature: nitrogen; and
Pressure of Atmosphere at Sintering Temperature: 1-10 torr; or (ii) Sintering Temperature: 1350°-1500° C.;
Atmosphere at Sintering Temperature: vacuum; and
Pressure of Atmosphere at Sintering Temperature: $10^{-2}$ torr or less.

(iii) Sintering Temperature: 1300°-1500° C.;
Atmosphere at Sintering Temperature: nitrogen or argon; and
Pressure of Atmosphere at Sintering Temperature: 1-200 atm.

The chemical composition of the cermet is limited as above for the following reason:

Co and Ni serve to enhance the toughness of the cermet. However, if the Co and/or Ni content is less than 5%, desired toughness cannot be secured, whereas in excess of 25%, the cermet has much degraded wear resistance. Therefore, the Co and/or Ni content is limited within a range from 5 to 25%.

Al may be added according to necessity, since it forms intermetallic compounds which act to strengthen the binder phase to thereby enhance the plastic deformation resistance of the cermet. However, if the Al content is less than 0.01%, desired results cannot be obtained, whereas if the Al content exceeds 2%, it will degrade the toughness of the cermet. Therefore, the Al content is limited within a range from 0.01 to 2%.

$Mo_2C$ and WC may be added to improve the sinterability of the green compact and hence enhance the strength of the resulting cermet. However, if the total content of $Mo_2C$ and WC is less than 5%, the strength cannot be enhanced to a desired degree, while if it exceeds 25%, the hard dispersed phase will have degraded hardness and hence degraded wear resistance. This is why the total content of MoC and WC is limited within a range from 5 to 25%.

TaC and NbC may be added to improve the oxidation resistance of the cermet. However, if the total content of TaC and NbC is smaller than 1%, the above properties cannot be improved to a desired degree, whereas even if it exceeds 30%, no further improvement can be obtained in the properties. Therefore, the total content of TaC and NbC is limited within a range from 1 to 30%.

ZrC and HfC may be added according to necessity, i.e. in a case where it is desired to further enhance the hardness of the cermet since they act to enhance the hardness of the cermet. However, if the total content of ZrC and HfC is less than 0.1%, the hardness cannot be improved to a desired degree, whereas if the total content exceeds 10%, the green compact will have low sinterability. Thus, the ZrC and/or HfC content is limited within a range from 1 to 10%.

In the method of manufacturing the surface-coated TiCN-base cermet material according to the invention, the ion plating conditions, i.e., reaction temperature, voltage applied on substrate, and pressure of reaction atmosphere, under which the hard surface layer is to be formed, are limited for the following reasons.

(a) Reaction Temperature

In order to achieve the aforementioned object of the invention, it is requisite to form a hard surface layer, which has high bond strength to the substrate and has a fine structure with a mean grain size of 0.05 microns or less under a reacting condition of high temperature and low pressure. However, if the reaction temperature is lower than 700° C., the reaction speed decreases due to the low pressure reaction atmosphere, and accordingly the resulting hard surface layer has insufficient bond strength to the substrate. On the other hand, if the reaction temperature exceeds 1000° C., the hard surface layer will have a coarsened grain size, thereby failing to obtain a desired fine structure with a mean grain size of not more than 0.05 micron. Therefore, the reaction temperature has been limited within a range from 700° to 1000° C., and more preferably within a range from 750 to 850° C.

(b) Voltage Applied on Substrate

If the voltage (negative voltage) applied on the substrate is lower than 100 volts, the resulting hard surface layer has insufficient bond strength to the substrate and is apt to exfoliate from the outer surfaces of the substrate during cutting of steel or the like. That is., the higher the voltage applied on the substrate the greater the bonding degree of the hard surface layer to the substrate. However, if the voltage exceeding 1000 volts is to be used, the reaction apparatus has to be excessively large in size and high in cost, resulting in uneconomy. Therefore, the voltage applied on the substrate has been limited within a range from $(-)100$ to $(-)1000$ volts, and more preferably within a range from $(-)500$ to $(-)900$ volts.

(c) Pressure of Reaction Atmosphere

As described above, the present invention aims to enhance the wear resistance and chipping resistance of the hard surface layer by adopting high reaction temperature to obtain high bond strength of the layer to the substrate and further adopting very low reaction atmosphere pressure to decrease the mean grain size of the hard surface layer to 0.05 microns or less. However, if the pressure of the reaction atmosphere is lowered below $1 \times 10^{-5}$ torr, the speed at which the hard surface layer is formed largely drops. On the other hand, if the pressure of the reaction atmosphere exceeds $2 \times 10^{-4}$ torr, the resulting hard surface layer will have a larger mean grain size than 0.05 microns, thereby failing to provide the hard surface layer with desired wear resistance and chipping resistance. Therefore, the pressure of the reaction atmosphere has been limited within a range from $1 \times 10^{-5}$ to $2 \times 10^{-4}$ torr, and more preferably within a range from $5 \times 10^{-5}$ to $1.5 \times 10^{-4}$ torr.

Further, the reason for specifying the mean thickness of the hard surface layer within a range from 0.5 to 10 microns is that if the mean thickness is less than 0.5 microns, desired wear resistance cannot be secured, whereas if the mean thickness is larger than 10 microns, there will be a degradation in the chipping resistance. A preferable mean thickness of the hard surface layer is from 1 to 5 microns.

As described above, it is requisite for the hard surface layer formed by the method of the invention to have a mean grain size of not more than 0.05 microns. If the mean grain size is larger than 0.05 microns, the resulting hard surface layer or the cermet material cannot exhibit satisfactory wear resistance and chipping resistance when it is used in high speed cutting of steel or the like at a cutting speed of 250 meters per minute or more.

An example of the method according to the invention will be given below.

EXAMPLE

Substrates of TiCN-base cermets were prepared by sintering green compacts having respective blending ratios shown in Table 1 under one of the aforementioned conditions (i)–(iii). These cermet substrates were subjected to ion plating to have their surfaces coated with hard surface layers through adjustment of the reaction temperature, the voltage applied on the substrates, the pressure of the reaction atmosphere, and the reaction time to respective values shown in Table 1 so that the hard surface layers had respective compositions, mean grain sizes, and mean layer thicknesses shown in Table 2, to obtain surface coated TiCN-base cermet materials Nos. 1–5 according to the method of the present invention as well as comparative surface coated TiCN-base cermet materials Nos. 1–4.

The comparative coated cermet materials Nos. 1–4 were prepared under such a condition that any one of the conditions for forming the hard surface layer, i.e., any one of the reaction temperature, the voltage applied on the substrate, and the pressure of the reaction atmosphere, falls out of the range of the present invention.

Then, in order to evaluate the bond strength of the hard surface layer to the substrate, the coated cermet materials according to the present invention and the comparative coated cermet materials were each subjected to a scratching test, wherein a critical load at which the hard surface layer is exfoliated from the surfaces of the substrate was measured by the use of a scratching tester.

Further, in order to evaluate the wear resistance, the above coated cermet materials were also subjected to a high speed steel-continuous cutting test under the following testing conditions:

Work Material: Round Bar according to SCM 415 (hardness: HB 150);
Cutting Speed: 300 m per minute;
Feed Rate: 0.2 mm per rev.;

TABLE 1

| | BLENDING RATIO OF COMPONENTS OF SUBSTRATE (WT %) | LAYER | COATING CONDITIONS | | | | |
|---|---|---|---|---|---|---|---|
| | | | COMPOSITION OF REACTION ATMOSPHERE (cc/min) | | | TEMPERATURE (°C.) | SUBSTRATE VOLTAGE (V) |
| | | | $N_2$ | $C_2H_2$ | $H_2$ | | |
| COATED CERMET MATERIALS ACCORDING TO THE INVENTION | | | | | | | |
| 1 | TaC:8, WC:19, Mo$_2$C:10, Ni:5, Co:11, TiCN:bal. | INNER | 75 | 25 | 10 | 800 | −800 |
| | | MIDDLE | — | — | — | — | — |
| | | OUTER | 140 | — | 10 | 750 | −600 |
| 2 | TaC:5, WC:12, Mo$_2$C:8, Ni:7, Co:8, TiCN:bal. | INNER | — | 70 | 10 | 900 | −900 |
| | | MIDDLE | 60 | 20 | 10 | 850 | −700 |
| | | OUTER | 80 | — | 10 | 750 | −700 |
| 3 | NbC:10, WC:10, Mo$_2$C:11, Ni:8, Co:9, TiCN:bal. | INNER | 87 | — | 10 | 700 | −500 |
| | | MIDDLE | — | — | — | — | — |
| | | OUTER | — | 120 | 10 | 900 | −300 |
| 4 | NbC:5, TaC:5, WC:8, Mo$_2$C:5, Ni:12, Co:6, TiCN:bal. | INNER | — | — | — | — | — |
| | | MIDDLE | — | — | — | — | — |
| | | OUTER | 170 | —· | 10 | 700 | −100 |
| 5 | TaC:10, WC:8, Mo$_2$C:7, Ni:3, Co:15, TiCN:bal. | INNER | — | 110 | 10 | 900 | −900 |
| | | MIDDLE | — | — | — | — | — |
| | | OUTER | 170 | — | 10 | 700 | −500 |
| COMPARATIVE COATED CERMET MATERIALS | | | | | | | |
| 1 | TaC:8, WC:15, Mo$_2$C:9, Ni:5, Co:11, TiCN:bal. | INNER | — | 110 | 10 | 300* | −500 |
| | | MIDDLE | — | — | — | — | — |
| | | OUTER | 120 | — | 10 | 300* | −100 |
| 2 | NbC:15, WC:8, Mo$_2$C:5, Ni:12, Co:6, TiCN:bal. | INNER | — | — | — | — | — |
| | | MIDDLE | — | — | — | — | — |
| | | OUTER | 120 | — | 10 | 1100* | −700 |
| 3 | TaC:5, WC:12, Mo$_2$C:8, Ni:7, Co:8, TiCN:bal. | INNER | 280 | — | 10 | 500* | −50* |
| | | MIDDLE | — | — | — | — | — |
| | | OUTER | — | 350 | 10 | 500* | −50* |
| 4 | NbC:10, WC:5, Mo$_2$C:5, Ni:16, TiCN:bal. | INNER | 500 | — | 10 | 500* | −300 |
| | | MIDDLE | — | — | — | — | — |
| | | OUTER | — | 450 | 10 | 500* | −300 |

| | COATING CONDITIONS PRESSURE OF ATMOSPHERE (torr) | TIME (min) | SCRATCHING TEST CRITICAL LOAD (N) | CONTINUOUS CUTTING FLANK WEAR (μm) | INTERMITTENT CUTTING (NUMBER OF CHIPPED INSERTS / NUMBER OF TESTED INSERTS) |
|---|---|---|---|---|---|
| COATED CERMET MATERIALS ACCORDING TO THE INVENTION | | | | | |
| 1 | $7 \times 10^{-5}$ | 120 | 65 | 0.21 | 0/10 |
| | — | — | | | |
| 2 | $1 \times 10^{-4}$ | 20 | 70 | 0.16 | 0/10 |
| | $5 \times 10^{-5}$ | 30 | | | |
| | $5 \times 10^{-5}$ | 110 | | | |
| 3 | $5 \times 10^{-5}$ | 80 | 75 | 0.22 | 1/10 |
| | $6 \times 10^{-5}$ | 70 | | | |
| | — | — | | | |
| 4 | $9 \times 10^{-5}$ | 60 | 70 | 0.25 | 0/10 |
| | — | — | | | |
| | — | — | | | |

TABLE 1-continued

| 5 | 1.5 × 10⁻⁴<br>8 × 10⁻⁵<br>—<br>1.5 × 10⁻⁴ | 110<br>60<br>—<br>60 | 70 | 0.17 | 1/10 |

COMPARATIVE COATED CERMET MATERIALS

| 1 | 8 × 10⁻⁵<br>—<br>8 × 10⁻⁵ | 60<br>—<br>80 | 35 | 0.58 | 8/10 |
| 2 | —<br>—<br>8 × 10⁻⁵ | —<br>—<br>90 | 45 | 0.40 | 10/10 |
| 3 | 5 × 10⁻⁴*<br>—<br>7 × 10⁻⁴* | 50<br>—<br>100 | 40 | 0.49 | 9/10 |
| 4 | 5 × 10⁻³*<br>—<br>5 × 10⁻³* | 40<br>—<br>50 | 45 | 0.42 | 10/10 |

*(THE NUMERAL MARKED WITH AN ASTERISK FALLS OUT OF THE RANGE OF THE PRESENT INVENTION.)

TABLE 2

| | HARD SURFACE LAYER ||||||||
| | INNER LAYER ||| MIDDLE LAYER ||| OUTER LAYER |||
| COMPO-SITION | MEAN GRAIN SIZE (μm) | MEAN THICK-NESS (μm) | COMPO-SITION | MEAN GRAIN SIZE (μm) | MEAN THICK-NESS (μm) | COMPO-SITION | MEAN GRAIN SIZE (μm) | MEAN THICK-NESS (μm) |
|---|---|---|---|---|---|---|---|---|
| COATED CERMET MATERIALS ACCORDING TO THE INVENTION |||||||||
| 1 TiCN | 0.02 | 3.5 | — | — | — | TiN | 0.03 | 0.5 |
| 2 TiC | 0.01 | 0.7 | TiCN | 0.02 | 2.5 | TiN | 0.02 | 2.0 |
| 3 TiN | 0.04 | 1.5 | — | — | — | TiC | 0.02 | 1.5 |
| 4 — | — | — | — | — | — | TiN | 0.05 | 3.5 |
| 5 TiC | 0.03 | 2.0 | — | — | — | TiN | 0.04 | 2.0 |
| COMPARATIVE COATED CERMET MATERIALS |||||||||
| 1 TiC | 0.13 | 0.8 | — | — | — | TiN | 0.19 | 0.9 |
| 2 — | — | — | — | — | — | TiN | 0.20 | 3.5 |
| 3 TiC | 0.17 | 0.7 | — | — | — | TiN | 0.17 | 2.0 |
| 4 TiN | 0.18 | 2.0 | — | — | — | TiC | 0.19 | 1.1 |

Depth of Cut: 1 mm;
Cutting Time: 20 minutes
In the above cutting test, the flank wear of each cutting insert was measured, the results of which are shown in Table 1.

Further, in order to evaluate the chipping resistance, the above coated cermet materials were also subjected to a high speed steel-intermittent cutting test under the following testing conditions. 10 pieces of cutting inserts of each of the coated cermet materials were subjected to the test:

Work Material: Square Bar according to SCM 439 (hardness :HB 250);
Cutting Speed: 250 m per minute;
Feed Rate: 0.15 mm per rev.;
Depth of Cut: 1 mm;
Cutting Time: 5·minutes The numbers of those cutting inserts which were chipped during the cutting test were measured, and the results are shown in Table 1.

It will be learned from Table 1 that all the coated cermet materials Nos. 1–5 according to the invention possess much higher bond strength to the substrate than the comparative coated cermet materials Nos. 1–4. Further the coated cermet materials Nos. 1–5 according to the invention, each having a mean grain size of the hard surface layer of not more than 0.05, all show much higher superiority in wear resistance and chipping resistance in high-speed cutting of steel or the like to the comparative coated cermet materials No. 1–4.

On the other hand, according to the comparative coated cermet materials Nos. 1–4, it is clear that if any one of the conditions for forming the hard surface layer falls out of the range of the present invention, the hard surface layer has degraded bond strength and/or has a coarsened mean grain size in excess of 0.05 microns, thereby making it impossible to obtain desired wear resistance and/or chipping resistance.

Therefore, the surface coated TiCN-base cermet materials according to the method of the present invention can exhibit excellent cutting ability over a very long period of use if they are used as cutting inserts in high speed cutting at 250 meters per minute or more in particular.

What is claimed is:

1. A method of manufacturing a surface-coated TiCN-base cermet material for inserts of cutting tools, comprising the steps of:
   (a) preparing a substrate of a TiCN-base cermet; and
   (b) coating over surfaces of said substrate a hard surface layer formed on one of a single layer of one compound selected from the group consisting of TiC, TiN, and TiCN, and a composite layer of at least two compounds selected from the same group, by means of an ion plating method under the following conditions:
   Reaction Temperature: 700° to 1000° C.;
   Voltage Appplied On Substrate: negative voltage of 100 to 1000 volts; and Pressure of Reaction Atmosphere: $1 \times 10^{-5}$ to $1.5 \times 10^{-4}$ torr, whereby said hard surface layer has a mean thickness of from 0.5 to 10 microns and a mean grain size of not more than 0.05 microns.

2. The method of manufacturing a surface coated TiCN-base cermet material as claimed in claim 1, wherein said reaction temperature is from 750° to 850° C.

3. The method of manufacturing a surface coated TiCn-base cermet material as claimed in claim 1, wherein said voltage applied on said substrate is a negative voltage of 500 to 900 volts.

4. The method of manufacturing a surface coated TiCN-base cermet material as claimed in claim 1, wherein said pressure of said reaction atmosphere is from $5 \times 10^{-5}$ to $1.5 \times 10^{-4}$ torr.

5. The method of manufacturing a surface coated TiCN-base cermet material as claimed in claim 1, wherein said hard surface layer has a mean thickness of from 1 to 5 microns.

6. The method of manufacturing a surface coated TiCN-base cermet material as claimed in claim 1, wherein said reaction temperature is at least 750° C.

7. The method of manufacturing a surface coated TiCN-base cermet material as claimed in claim 6, wherein said hard surface layer has a mean thickness of from 1 to 5 microns.

8. The method of manufacturing a surface coated TiCN-base cermet material as claimed in claim 6, wherein said reaction temperature is from 750° to 850° C.; said voltage applied on said substrate is a negative voltage of 500 to 900 volts and said pressure of said reaction atmosphere is from $5 \times 10^{-5}$ to $1.5 \times 10^{-4}$ torr.

9. The method of manufacturing a surface coated TiCN-base cermet material as claimed in claim 1, wherein said reaction temperature is from 750° to 850° C.; said voltage applied on said substrate is a negative voltage of 500 to 900 volts and said pressure of said reaction atmosphere is from $5 \times 10^{-5}$ to $1.5 \times 10^{-4}$ torr.

* * * * *